United States Patent [19]

Ichimiya et al.

[11] 4,216,533
[45] Aug. 5, 1980

[54] PATTERN GENERATOR

[75] Inventors: Yoshichika Ichimiya, Tokorozawa; Tsuneta Sudo, Kodaira; Katsumi Shimada, Fukiage, all of Japan

[73] Assignees: Nippon Telegraph and Telephone Public Corporation; Takeda Riken Kogyo Kabushikikaisha, both of Japan

[21] Appl. No.: 23,458

[22] Filed: Mar. 23, 1979

[30] Foreign Application Priority Data

Mar. 29, 1978 [JP] Japan .................................. 53/37006

[51] Int. Cl.² ............................................ G11C 11/40
[52] U.S. Cl. ...................................... 365/230; 365/73
[58] Field of Search ..................... 365/189, 49, 73, 230

[56] References Cited

U.S. PATENT DOCUMENTS 4,064,558  12/1977  Hughes et al. ....................... 365/230

Primary Examiner—Terrell W. Fears
Attorney, Agent, or Firm—Staas & Halsey

[57] ABSTRACT

A plurality of low-speed memories having stored therein a plurality of patterns and first and second high-speed memories of higher operating speed than the low-speed memories are provided. One of the first and second high-speed memories is read to obtain output patterns and, at the same time, the plurality of low-speed memories are simultaneously read and the read-out data are successively written in the other high-speed memory alternately with each other. Upon completion of pattern generation from the one high-speed memory, pattern generation from the other high-speed memory is achieved.

10 Claims, 8 Drawing Figures

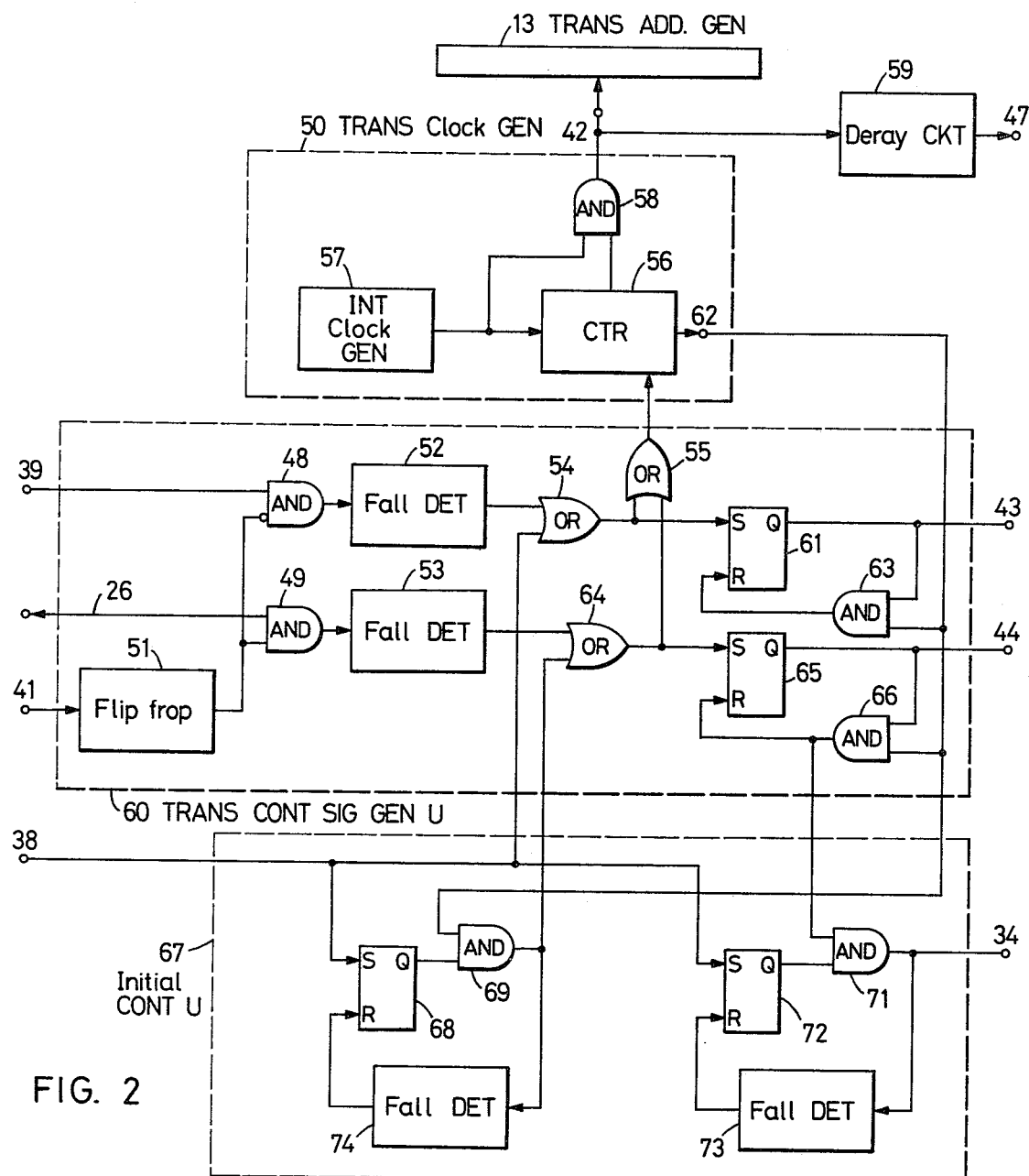
FIG. 2
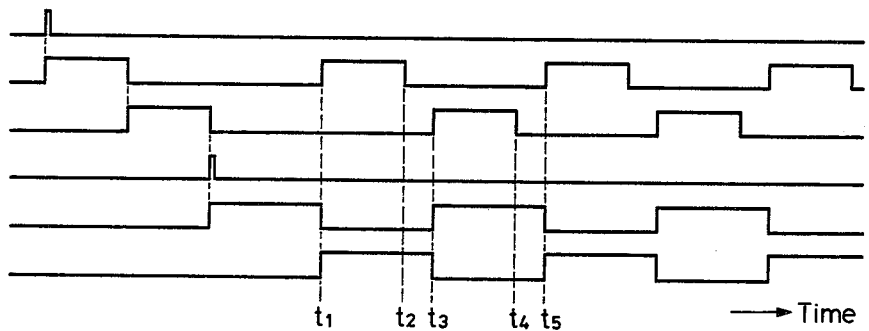
FIG. 3A
FIG. 3B
FIG. 3C
FIG. 3D
FIG. 3E
FIG. 3F
$t_1$ $t_2$ $t_3$ $t_4$ $t_5$ → Time

PATTERN GENERATOR

BACKGROUND OF THE INVENTION

This invention relates to a pattern generator for generating at high speed a large number of patterns, each composed of a plurality of bits, for testing the operation of a semiconductor element, such as, for example, a microprocessor semiconductor integrated circuit, a semiconductor memory or the like.

In a conventional pattern generator of this kind, for example, a memory having stored therein many patterns is read by an electronic computer and the read-out patterns are supplied to a semiconductor element under test. In the prior art, one or more memories of the same operating speed are employed for storing patterns and the stored patterns are successively read out programatically. The more complicated the semiconductor element under test becomes, the more patterns are required and the longer the time of test becomes; therefore, it is desired to test the semiconductor element at as high speed as possible. But a large-capacity memory of high operating speed is not available, so that in order to generate a large number of patterns at high speed, it is necessary to use a large number of small-capacity and expensive high-speed memories, but this presents problems of package and cost.

There has been proposed a system in which a plurality of low-speed memories are simultaneously accessed to read out thereof patterns and the patterns thus read out of the memories are successively derived by a multiplexer and applied to an element under test at high speed. This system does not pose any problem in the case of reading memories in the order of address but, in the case of reading the memories while changing the address at random, for example, skipping over some addresses, a dummy cycle, that is, a cycle in which no pattern is generated, is inserted, so that a semiconductor element is tested at a lower speed than its operating speed and its state may in some cases vary during the dummy cycle. Consequently, no accurate test is achieved, or the test is conducted at a low speed as a whole to result in the test becoming time-consuming. In an actual test, an address for the memory having stored therein patterns is not simply updated but, in many cases, the address changes in a complicated manner, for example, turns back, skips forward or repeatedly circles, by which an accurate test is conducted. Accordingly, it is difficult to simultaneously access the low-speed memories for generating complicated patterns at high speed as a whole.

An object of this invention is to provide a pattern generator in which a large number of complicated patterns can be generated by the combined use of low-speed and high-speed memories at high speed without any dummy cycle to ensure that a complicated semiconductor element is tested in a short time and with high accuracy.

SUMMARY OF THE INVENTION

According to this invention, there are provided a plurality of low-speed memories respectively having stored therein patterns and first and second high-speed memories of higher operating speed. One of the high-speed memories is read via pattern data select means to provide a pattern output and, at the same time, the plurality of low-speed memories are simultaneously accessed to read out thereof the plurality of patterns, which are successively selected by transfer data select means and written in the other high-speed memory. First and second address selectors are provided, which select one of a pattern generating address from a pattern address generator and low order bits of a transfer address from a transfer address generator. The address selected by the first address selector is supplied as an address to the first high-speed memory and the address selected by the second address selector are applied as an address to the second high-speed memory. Upon completion of reading of one of the first and second high-speed memories, an end signal is provided from the pattern address generator to a control circuit, which changes over the address selection in the first and second address selectors and, at the same time, applies to the transfer address generator clocks for reading patterns out of the plurality of low-speed memories, thereby generating a predetermined number of transfer addresses, that is, by the number of words of one high-speed memory. The control circuit also control transfer data select means. With such an arrangement, it is possible not only to simply step the address in one high-speed memory but also to cause it to perform complicated changes such as jumping, circling, etc. On top of that, no dummy cycle is generated. Moreover, while one of the high-speed memories is read, patterns can be transferred from the plurality of low-speed memories and a large number of patterns can be stored in the low-speed memories.

BRIEF DESCRIPTION OF THE DRAWINGS

FIG. 2 is a block diagram showing an example of a control unit 37 utilized in FIG. 1; and FIGS. 3A–3F, is a time chart explanatory of the operation of the embodiment of FIG. 1.

DESCRIPTION OF THE PREFERRED EMBODIMENTS

Figure 1:
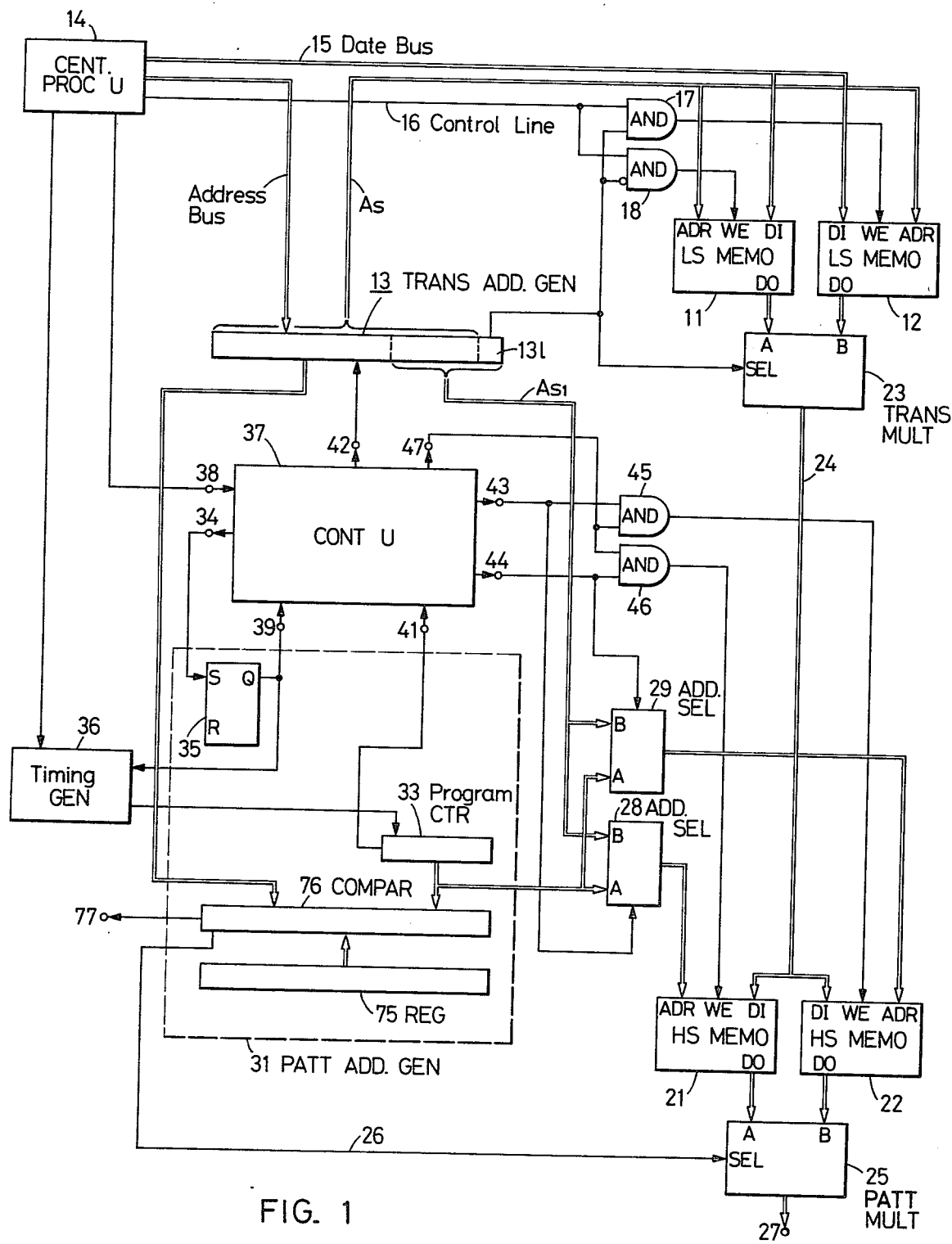
FIG. 1 is a block diagram illustrating an embodiment of a pattern generator of this invention.

Referring first to FIG. 1, two memories 11 and 12 are provided as low-speed memories in this embodiment. Addresses for the low-speed memories 11 and 12 are applied in common thereto from a transfer address generator 13. But the least significant bit 13*l* of the transfer address generator 13, that is, the so-called program counter, is not supplied to the low-speed memories 11 and 12. The low-speed memories 11 and 12 have prestored therein pluralities of patterns. For example, under the control of a central processing unit 14, patterns from a magnetic disc, a magnetic tape or like large-capacity memory (not shown) are provided via a data bus 15 to the low-speed memories 11 and 12. From the central processing unit 14 are applied write commands to AND gates 17 and 18 via a control line 16. To the AND gate 17 is directly supplied the content of the least significant bit 13*l* of the transfer address generator 13, and an inverted signal of the least significant bit 13*l* is applied to the AND gate 18. The content of the transfer address generator 13, that is, an address, is set by the central processing unit 14 and the address is successively added with 1. Accordingly, when the address is an even one, the least significant bit 13*l* assumes a low level to open the gate 18, through which a write command is passed on to a write enable terminal of the low-speed memory 11 to write therein data in the data bus 15 at an address As assigned by the address generator 13. Where the least significant bit 13*l* assumes a high level, a write command from the gate 17 is applied to a write enable terminal of the low-speed memory 12 to write therein data in the data bus 15 at an address assigned by the address generator 13. In this manner, a plurality of patterns, each composed of a plurality of bits, are each prestored as one word in the low-speed memories 11 and 12, that is, all patterns necessary for one test are stored. The number of bits for each word, that is, the number of bits for each pattern is usually 64 or more. The low-speed memories 11 and 12 are relatively low in operating speed but have a large storage capacity, for example, of 16K words.

In this invention, first and second high-speed memories 21 and 22 are provided whose operating speeds are higher than the low-speed memories 11 and 12. The first and second high-speed memories 21 and 22 respectively have a relatively small storage capacity, for example, of 512 words. One of the high-speed memories 21 and 22 are read to send out therefrom patterns as output patterns and, at the same time, the low-speed memories 11 and 12 are read to successively write patterns in the other high-speed memory. Upon completion of reading of the abovesaid one high-speed memory, the other high-speed memory is read and the patterns read out of the low-speed memories 11 and 12 are transferred to the memory which have been read until then. Thereafter, the above operations are repeatedly carried out.

Accordingly, the low-speed memories 11 and 12 are simultaneously read and the read-out patterns are switchingly supplied to the one high-speed memory; for this purpose, a transfer multiplexer 23 is provided as transfer data select means. The multiplexer 23 is controlled in accordance with the content of the least significant bit 13*l* of the transfer address generator 13. That is, when the least significant bit 13*l* is at the low level, the data read out of the low-speed memory 11 are provided via the multiplexer 23 to a transfer line 24; and when the least significant bit 13*l* is at the high level, the data read out of the low-speed memory 12 are provided via the multiplexor 23 to the transfer line 24. The data are supplied via the transfer line 24 in parallel to the data input sides of the high-speed memories 21 and 22.

The data read out of the high-speed memories 21 and 22 are applied to a pattern multiplexor 25 serving as pattern data select means. The multiplexor 25 is controlled in accordance with the content of a control line 26 and when its content is at a low level, patterns read out of the first high-speed memory 21 are provided as output patterns to an output terminal 27; and when the control line 26 is at a high level, the data read out of the second high-speed memory 22 are sent out as an output patterns to the output terminal 27 via the multiplexor 25.

Address selectors 28 and 29 are provided, which are each supplied with an address Ap from a pattern address generator 31 and low order bits As1 of an address of the transfer address generator 13 and outputs a select one of them. The address selected by the address selector 28 is applied to the address input side of the first high-speed memory 21, while the address selected by the address selector 29 is applied to the address input side of the second high-speed memory 29.

The pattern address generator 31 may be one that has the same construction as a conventional pattern generator of this kind and, in the pattern address generator 31, a pattern program counter 33 is provided. The content of the pattern address counter 33 is applied as the pattern address Ap to the address selectors 28 and 29. Upon application of a start signal from a terminal 34 to the pattern address generator 31, a flip-flop 35 in the generator 31 is set to raise its Q output to a high level, which is provided to a timing generator 36. When this signal is supplied to the timing generator 36, timing preassigned by the central processing unit 14 is provided to the program counter 33 of the address generator 31 to step it. The number of bits of the low order bit As1 of the transfer program counter 13 is selected to be equal to the number of bits of the pattern program counter 33.

A control unit 37 is provided, which starts to operate when supplied with a start command from the central processing unit 14 via a terminal 38. The control unit 37 is supplied with the output from the flip-flop 35 of the pattern address generator 31 via a terminal 39 and a carry output via a terminal 41 from the program counter 33 as a signal indicating completion of read out of the high-speed memory 21 or 22. The control unit 37 provides via a terminal 42 clock pulses of the same number as the words of the high-speed memory 21 to the transfer address generator 13 to step it. Further, the control unit 37 applies first and second transfer control signals to control terminals of the address selectors 28 and 29 via terminals 43 and 44, respectively. When the transfer control signals are at their high level, the address selectors 28 and 29 select the low order bit As1 of the transfer program counter 13 and when the transfer control signals are at their low level, the address selectors 28 and 29 select the address Ap of the pattern program counter 33. Further, the first and second transfer control signals are also applied to AND gates 45 and 46, to each of which is supplied via a terminal 47 of the control unit 17 a write clock delayed behind the clock from the terminal 42 by a certain value. The outputs from the AND gates 45 and 46 are respectively applied to write enable terminals of the first and second high-speed memories 21 and 22. Accordingly, for example, if the terminal 45 is at the high level, the write clock is provided to the write enable terminal of the high-speed memory 21 to write therein data from the transfer line 24, i.e. the pattern read out of the low-speed memories, at an address assigned by the low order bit of the transfer generator 13 provided via the address selector 29. At this time, the terminal 44 is at the low level, the second high-speed memory 22 is read at an address assigned by the content of the program counter 33 via the address selector 28.

The control unit 37 has, for example, such a construction as shown in FIG. 2. That is, when the address generator 31 is put in its operative state to set its flip-flop 39, a high-level output is supplied to AND gates 48 and 49 from a terminal 39. The carry output from the pattern program counter 33 is provided via the terminal 41 to a flip-flop 51 of the control unit 37. Upon each application of the carry signal from the terminal 41, the state of the flip-flop 51 is inverted and its output is inverted and provided to the AND gate 48 and, at the same time, supplied to the AND gate 49 without being inverted. The outputs from the AND gates 48 and 49 are respectively provided to fall detectors 52 and 53 for detecting the falls of the AND gate outputs. Let it be assumed that in its initial state, the flip-flop 51 is set and that while the first high-speed memory 21 is read, the output from the flip-flop 41 is at its low level. Accordingly, the output from the AND gate 48 is at its high level. Upon completion of read out of the high speed memory 21 to yield the carry output from the program counter 33, the flip-flop 51 is inverted to provide a high-level output, while the output from the AND gate 48 becomes low-level and its fall is detected by the fall detector 50.

The detected output is provided via OR gates 54 and 55 to a counter 56 to drive it. The counter 56 starts to count clock pulses from an internal clock generator 57 provided in the control unit 37 and applies a high-level output to an AND gate 58 until counting the clock pulses by the number of words of the first high-speed memory 21. In this while, the internal clock from the internal clock generator 57 is provided as a transfer clock via the AND gate 58 and the terminal 42 to the transfer address generator 13 to step its state. The transfer clock at the clock terminal 42 is applied as the transfer clock via a delay circuit 59 to a terminal 47. That is, an address is applied from the program counter 13 to the low-speed memories 11 and 12 shown in FIG. 1 and, at the same time, the transfer clock is supplied from the terminal 41 to the high-speed memory 21 to write therein data read out of the memories 11 and 12 in synchronism with the abovesaid address application. The counter 56, the internal clock generator 57 and the gate 58 from the transfer clock generator 50. By the output from the OR gate 54, that is, a signal indicating the completion of reading of the high-speed memory 21, a flip-flop 61 is set and its Q output becomes high-level and is applied to the terminal 43, starting to write data in the first high-speed memory 21. When supplied with transfer pulses equal in number to the words of the high-speed memory 21, the counter 56 provides a count end signal at a count end terminal 62. The count end signal is applied to an AND gate 63. Since the AND gate 63 is supplied with the Q output from the flip-flop 61, the latter is reset by the output from the former. That is, upon completion of pattern transfer to the first high-speed memory 21 from the low-speed memories 11 and 21, a first transfer control signal at the terminal 43 becomes low-level to close the gate 45 in FIG. 1, completing the write in the first high-speed memory 21. In this while, a second transfer control signal at the terminal 44 remains low-level, and the address selector 29 selects the address from the pattern program counter 33 and the second high-speed memory 22 is read at the address selected by the address selector 29. This read operation continues even after completion of write in the first high-speed memory 21. In the state in which the flip-flop 61 is reset and the first transfer control signal is also low-level, the address selector 28 also selects the address from the program counter 33 and the first high-speed memory 21 is read at the selected address. At this time, however, the multiplexor 25 selects the pattern read out of the second high-speed memory 22, as will be described later. Upon completion of read out of the second high-speed memory 21, a carry signal is yielded from the pattern program counter 33 to invert the state of the flip-flop 51 to make its output low-level. As a consequence, the output from the AND gate 49 falls to its low level, which is detected by the fall detector 53. The detected output from the fall detector 53 is provided via an OR gate 64 and an OR gate 55 to the counter 56 to drive it. Consequently, a predetermined number of clock pulses are supplied to the transfer address generator 13 to update the addresses generated therefrom. The output from the OR gate 64 is provided to the flip-flop 65 to set it and its Q output is applied to the terminal 44 to raise the second transfer control signal to its high level. As a result of this, the address selector 29 selects the transfer address As1 to write in the second high-speed memory 22. Upon completion of this write-in operation, the counter 56 derives a count end signal at the terminal 62, which signal is provided via the gate 66 supplied with the Q output of the flip-flop 65 to reset it. Next, when read out of the first high-speed memory 21 is finished, the flip-flop 51 is inverted again to repeat the abovesaid operation. In this way, the high-speed memories 21 and 22 are read out alternately with each other and, in this case, data from the low-speed memory are written in that one of the high-speed memories which is not read out. The simplest method of read of the high-speed memories is to read them in the order of address and the read-out period is equal to the data write-in period. In general, read addresses are often altered in a complicated manner and the same address may in some cases be applied a plurality of times, so that the read-out period becomes longer than the write-in period and, in this read-out period of one of the high-speed memories, the data write-in operation of the other memory can be finished without fail. The flip-flop 51, and AND gates 48, 49, 63 and 66, the fall detectors 52 and 53, the OR gates 54, 55 and 64 and the flip-flops 61 and 65 make up a transfer control signal generating unit 60.

Before the pattern generator is started, it is necessary to write data in at least one of the high-speed memories 21 and 22. In this embodiment, after writing data in the both high-speed memories 21 and 22, reading of the memory 21 takes place to start the pattern generating operation. To perform this, an initial control unit 67 is provided in the control unit 37. As shown in FIG. 2, when a device start command is applied via the terminal 38 to the initial control unit 67 from the central processing unit 14, a flip-flop 68 is set and its Q output rises up to its high level to open an AND gate 69 and, at the same time, the start signal applied to the terminal 38 is provided via the OR gate 54 to the flip-flop 61 to set it to provide the first transfer control signal at the terminal 43 and the transfer clock generator 50 is driven via the OR gate 55. As a result of this, patterns are read out of the low-speed memories 11 and 12 and written in the first high-speed memory 21.

When the patterns have been written in the high-speed memory 21 at its all addresses, a count end signal is derived at the terminal 62 of the transfer clock generator 50, by which signal the flip-flop 68 is reset to make the first transfer control signal at the terminal 41 low-level. At the same time, the count end signal is provided via the AND gate 69 to the OR gate 64. Consequently, the flip-flop 65 is set by the output from the OR gate 64 to provide the second transfer control signal at the terminal 44, and, further, the transfer clock generator 50 is driven via the OR gate 55. As a result of this, data are read out of the low-speed memories 11 and 12 and written in the high-speed memory 22. Upon completion of writing the data in the high-speed memory 22 at its all addresses, the transfer clock generator 60 produces a count end signal, which is applied via the AND gate 66 to the flip-flop 65 to reset it, making the second transfer control signal low-level. The reset signal for the flip-flop 65 is supplied to an AND gate 71.

When the device start signal is applied to the terminal 38, a flip-flop 72 is also set by this signal, and its Q output is provided to the AND gate 71 to open it. Accordingly, when the second transfer control signal ends and the reset signal for the flip-flop 65 occurs, the AND gate 71 provides an output, which is applied as a pattern generation start signal via the terminal 34 to the pattern address generator 31. At the same time, the fall of the AND gate 71 is detected by a fall detector 73, whose detected output is provided to the flip-flop 72 to reset it. Further, the output from the AND gate 69 is also supplied to a fall detector 74, which detects the fall of the output from the AND gate 69 after completion of writing in the first high-speed memory 21 and whose detected output is supplied to the flip-flop 68 to reset.

Accordingly, once the pattern generation start signal has occurred at the terminal 34 upon completion of the transfer of patterns to the high-speed memories 21 and 22 as a result of application of the device start signal to the terminal 38, the flip-flops 68 and 72 are both held in their reset state to retain both of the gates 69 and 71 in their closed state; no matter how many times the transfer clock generator 50 may yield count end signals, they do not pass through the AND gates 69 and 71.

After completion of the pattern transfer to both of the high-speed memories 21 and 22, the start signal occurs at the terminal 34 to start the pattern address generator 31. At this time, since no carry signal is produced by the program counter 33, the output from the flip-flop 51 is at its low level. The output from the flip-flop 51 is applied as a control signal to the pattern multiplexor 24 via the control line 26. Consequently, when the pattern address generator 31 starts its operation, the signal in the control line is low-level and the pattern multiplexer 24 selects the output read out of the first high-speed memory 21. The Q outputs of the flip-flops 61 and 62 are both low-level, and consequently the first and second transfer control signals are both low-level, and the address selectors 28 and 29 select the address Ap from the program counter 33. Thus, the high-speed memories 21 and 22 are both read out but only the pattern read out of the memory 21 is provided as an output pattern at the terminal 27.

Upon completion of generation of all patterns necessary for test, the program counter 33, the flip-flop 51 and the other elements are all set in their initial state. Also in the prior art, an address indicating the completion of generation of all patterns is set as a pattern generation end address in a register 75 of the pattern address generator 31. The low order bits of the program counter 33 corresponding thereto are compared by a comparator 76, and the high order bits of the register 75 and those of the transfer address generator 13 respectively corresponding thereto are similarly compared by the comparator 76. When all the bits match with each other, a device end signal is derived at a terminal 77, by which all of the circuits are restored to their initial state and this is informed to the central processing unit 14.

With reference to the time chart shown in FIG. 3, the operations of the device described above will be explained. After all patterns necessary for testing are written in the low-speed memories 11 and 12 under the control of the central processing unit 14, a device start pulse is applied to the control unit 37 from the terminal 38, as shown in FIG. 3A. At the terminal 43 of the control unit 37, a first transfer control signal occurs to achieve data transfer from the low-speed memories 11 and 12 to the first high-speed memory 21, as depicted in FIG. 3B. When the first transfer control signal becomes low-level upon completion of the data transfer, a second transfer control signal is provided from the terminal 44 of the control unit 37, as shown in FIG. 3C, by which data transfer is achieved from the low-speed memories 11 and 12 to the second high-speed memory 22. When the second transfer control signal becomes low-level for the first time after completion of the data transfer, a pattern start signal is produced at the terminal 34 of the control unit 37, as depicted in FIG. 3D, which signal is applied to the pattern generator 31. As a result of this, the data read out of the first high-speed memory 21 are outputted as patterns, as shown in FIG. 3E. Upon completion of the pattern generation from the first high-speed memory 21, a carry signal is derived from the pattern program counter 33 and the flip-flop 51 of the control unit 37 is inverted, which is detected completion of the pattern generation. Then, the pattern multiplexor 25 is changed over and the data read out of the second high-speed memory 22 are outputted as patterns, as depicted in FIG. 3F. Further, at a moment $t_1$, the first transfer control signal is provided again at the terminal 43, as illustrated in FIG. 3B. The control unit 37 supplies the transfer address generator 13 with transfer clocks equal in number to the words of one high-speed memory. With output addresses from the address generator 13, the low-speed memories 11 and 12 are accessed and read. A control signal for the address selector 28 becomes high-level and the address selector 28 selects the low order bit of the transfer address generator 13, and the selected address is applied to the address terminal of the first high-speed memory 21. A transfer clock at the terminal 47, which is so time-adjusted as to match in phase with the address, is provided to the write enable terminal of the first high-speed memory 21 to perform data transfer from the low-speed memories 11 and 12 to the first high-speed memory 21.

This data transfer terminates at a moment $t_2$. When reading of patterns from the second high-speed memory 22 terminates at a moment $t_3$ as shown in FIG. 3F, the second transfer control signal occurs again as depicted in FIG. 3C to achieve data transfer from the low-speed memories 11 and 12 to the second high-speed memory 22 and, as shown in FIG. 3E, the pattern generation from the first high-speed memory 21 takes place. The data transfer to the second high-speed memory 22 terminates at a moment $t_4$, as depicted in FIG. 3C, and at a moment $t_5$ the pattern generation from the first high-speed memory 21 comes to an end, as shown in FIG. 3E, and the first transfer control signal occurs, as depicted in FIG. 3B. The state at the moment $t_5$ is the same as that at the moment $t_1$ and the above operations are repeated.

As has been described above, according to the pattern generator of this invention, patterns read out of the high-speed memory 21 or 22 are provided at the output terminal 27, so that the patterns can be generated at high speed. In addition, the two high-speed memories are employed and during reading of one of them, data can be transferred to the other from the plurality of low-speed memories 11 and 12. The low-speed memories 11 and 12 are simultaneously accessed and the data read out therefrom are supplied to a selected one of the high-speed memories, so that the operating speed of the low-speed memories may be $\frac{1}{2}$ that of the high-speed memories. Since the low-speed memories 11 and 12 are low in operating speed, large-capacity memories are available at low cost. Further, since it is sufficient only to transfer data from the low-speed memories 11 and 12 to the high-speed memory, the address for accessing it is successively changed and need not be varied complicatedly. On the other hand, that one of the high-speed memories which is currently generating patterns can be accessed with complicated address variations and, on top of that, there is no fear of generation fo a dummy cycle; therefore, an element under test can be tested accurately. As the two high-speed memories are used alternately with each other, a large number of patterns can be generated at high speed.

In experiments in which the low-speed memories 11 and 12 had an operating cycle of 19 nsec and a storage capacity of 16 K words and the high-speed memories 21 and 22 had an operating cycle of 10 nsec and a storage capacity of 512 words, complicated patterns could be generated with the period of 10 nsec without any dummy cycle.

In the embodiment described above, it is possible to omit the flip-flop 51 of the control unit 37, increase the number of bits of the pattern program counter 33 a counter by one and use the output of its most significant bit as the output of the flip-flop 51. Also, it is possible to omit the pattern multiplexer 25, interconnect the read output terminals of the high-speed memories 21 and 22 in a wired OR manner, use, as the memories 21 and 22, memories having chip select terminals and connect the chip select terminals to the control line 26, one directly and the other through an inverter. The address selectors 28 and 29 may also be provided on chips of the first and second high-speed memories 21 and 22, respectively. Further, each of the low-speed memories 11 and 12 may also be replaced with a plurality of ultra-low-speed memories of lower operating speed; in this case, these ultra-low-speed memories are simultaneously read and the read out data are successively written in one low-speed memory. That is, a multistage construction can also be adopted. The number of low-speed memories may be three or more and, in such a case, memories of lower operating speed can be employed as the low-speed memories.

It will be apparent that many modifications and variations may be effected without departing from the scope of the novel concepts of this invention.

What is claimed is:

1. A pattern generator comprising:
   a plurality of low-speed memories of the same operating speed, each having stored therein a plurality of patterns;
   first and second high-speed memories of higher operating speed than the low-speed memories and of the same storage capacity;
   pattern data select means connected between the plurality of low-speed memories and the first and second high-speed memories to select and transfer one of data simultaneously read out of the low-speed memories as write data to the first and second high-speed memories;
   a pattern address generator for producing a pattern generating address;
   a transfer address generator for generating a transfer address;
   a first address selector for selecting and transferring one of the pattern generating address from the pattern address generator and a low order bit of the transfer address from the transfer address generator;
   a second address selector for selecting and transferring one of the pattern generating address from the pattern address generator and the low order bit of the transfer address from the transfer address generator to the second high-speed memory; and
   a control unit for controlling the transfer data select means, the pattern data select means and the first and second address selectors so that the pattern address from the pattern address generator is applied to one of the first and second high-speed memories to read out thereof data and output them as output patterns from the pattern data select means and that the transfer address from the transfer address generator is applied to all of the low-speed memories to read out thereof data and the low order bits of the transfer address are applied to the other of the first and second high-speed memories to successively write therein the data read out of the low-speed memories via the transfer select means, and that upon completion of reading of the said one high speed memory, the low order bits of transfer address are applied to the said one high speed memory to write therein the data read out fo the low speed memories and, at the same time, the pattern address is applied to the other high speed memory to read out thereof data and output them as output patterns from the pattern data select means.

2. A pattern generator according to claim 1, wherein the control unit includes a transfer clock generator unit which, upon each application thereto of a high-speed memory read end signal from the pattern address generator, generates transfer clock pulses equal in number to words of one of the high-speed memories, the transfer clock pulses being supplied to the transfer address generator.

3. A pattern generator according to claim 2, wherein the control unit includes a transfer control signal generator which generates first and second transfer control signals alternately with each other upon each application thereto of the read end signal from the pattern address generator and stops the generation of the transfer control signals upon reception of a signal indicating completion of the clock generation from the transfer clock generator, the first and second transfer control signals being supplied to the first and second address selectors to cause them to select and output the low order bit of the transfer address while the first and second transfer control signals exist.

4. A pattern generator according to claim 3, which includes a first gate controlled by the first transfer control signal to provide the transfer clock pulses to a write enable terminal of the first high-speed memory and a second gate controlled by the second transfer control signal to provide the transfer clock pulses to a write enable terminal of the second high-speed memory.

5. A pattern generator according to claim 1, wherein the control unit includes an initial control unit which is supplied with a device start signal to write the data read out of the low-speed memories in both of the first and second high-speed memories individually and then generate a start signal for the pattern address generator.

6. A pattern generator according to claim 1, wherein the transfer data select means is a multiplexor, and wherein one or more bits including the least significant bit of the transfer address from the transfer address generator is applied as a select control signal to the multiplexor.

7. A pattern generator according to claim 1, wherein the pattern data select means is a multiplexor and wherein the control unit includes a select signal generating unit for generating a select control signal which inverts its state upon each generation of a carry of a program counter of the pattern address generator, the select control signal being applied to the pattern multiplexor to control it.

8. A pattern generator according to claim 7, wherein the select signal generating unit is added as the most significant bit stage to the program counter.

9. A pattern generator according to claim 1, wherein the first and second high-speed memories respectively have output enable terminals, the output enable terminals being interconnected in a wired OR manner, and wherein the pattern data select means is constructed so that select control signals are applied to the output enable terminals from the control unit to select the data read out of the first and second high-speed memories.

10. A pattern generating according to claim 1, wherein a device end address is set in a register of the pattern address generator, and wherein there is provided means for making a comparison between high order bits of the transfer address generator and high order bits of the device end address and between the contents of a program counter of the pattern address generator and remaining low order bits of the device end address to generate a device end signal when all the bits match with each other.

* * * * *

UNITED STATES PATENT AND TRADEMARK OFFICE
CERTIFICATE OF CORRECTION

PATENT NO. : 4,216,533

DATED : 5 August 1980

INVENTOR(S) : Ichimiay et al

Page 1 of 7

It is certified that error appears in the above-identified patent and that said Letters Patent is hereby corrected as shown below:

In the drawings, Figs 1 and 2 should be shown as follows.

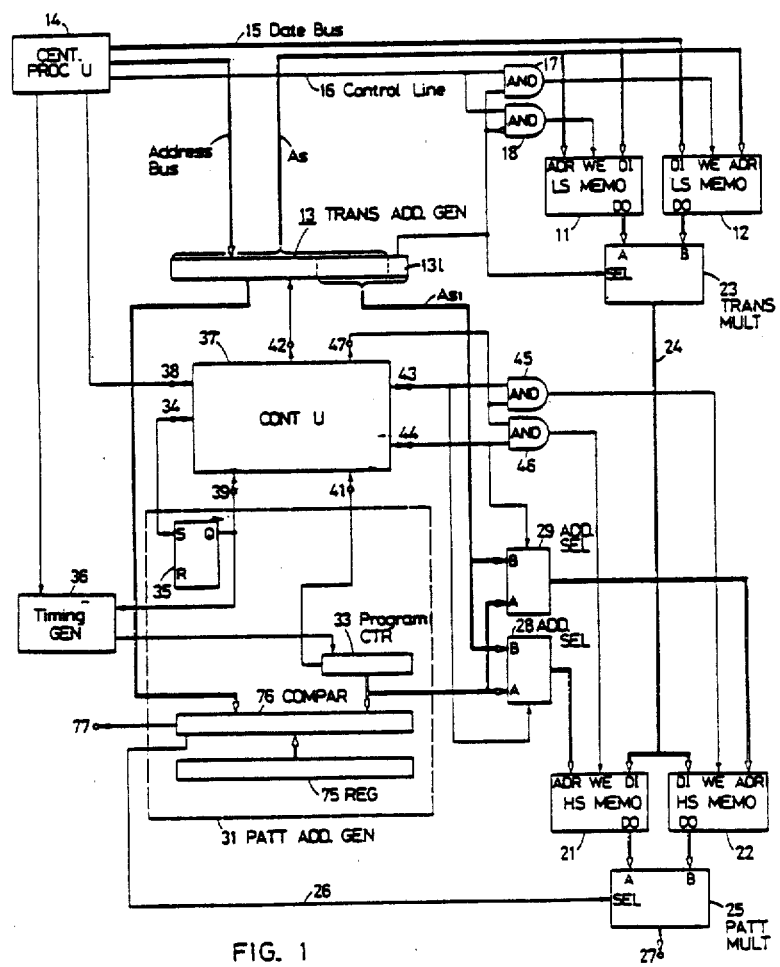

FIG. 1

UNITED STATES PATENT AND TRADEMARK OFFICE
CERTIFICATE OF CORRECTION

PATENT NO. : 4,216,533

DATED : 5 August 1980

INVENTOR(S) : Ichimiya et al

It is certified that error appears in the above-identified patent and that said Letters Patent is hereby corrected as shown below:

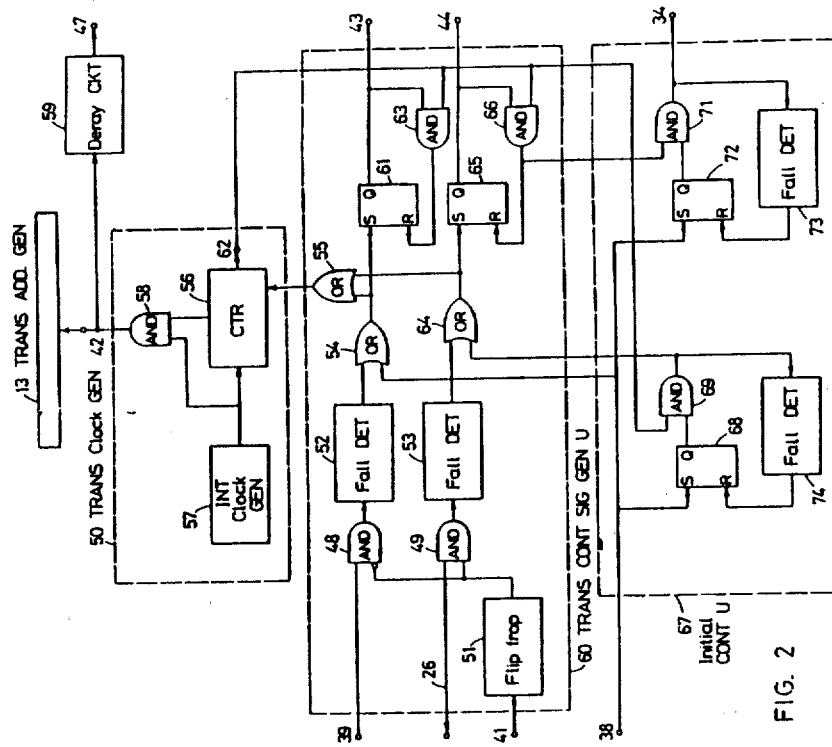

FIG. 2

UNITED STATES PATENT AND TRADEMARK OFFICE
CERTIFICATE OF CORRECTION

PATENT NO. : 4,216,533

DATED : 5 August 1980

INVENTOR(S) : Ichimiya et al

It is certified that error appears in the above-identified patent and that said Letters Patent is hereby corrected as shown below:

```
Col. 1,     line 17, after "out" insert --according to a--;
            line 18, "gramatically" should be --gram--;
            line 22, after "high" insert --a--
            line 31, "derived" should be --provided--;
            line 34, delete "the";
            line 43, change "whole to result" to --whole,
       resulting--;
            after line 51, insert as a centered title,
       --SUMMARY OF THE INVENTION--;
            line 60, delete entire line.
Col. 2,     line 5, change "low" to --lower--;
            line 9, change "are" to --is--;
            line 11, after "of" insert --the--;
            line 16 change "clocks" to --clock signals--;
            line 19, delete "by"; change "one" to --each--;
            line 20, change "control" to --controls--;
            line 22, change "one" to --each--;
            line 24, change "On top of that" to --Further--.
Col. 3,     line 20, change "are" to --is--;
            line 27, change "have been read until then" to
       --was previously read--;
            line 31, delete "the";
            line 52, delete "an";
            line 57, change "low" to --lower--;
            line 58, change "select" to --selected--;
            line 63, change "29" to --22--;
Col. 4,     line 9, change "the low order bit" to --lower
       order in--;
            line 40, change "45" to --43--;
```

UNITED STATES PATENT AND TRADEMARK OFFICE
CERTIFICATE OF CORRECTION

PATENT NO. : 4,216,533

DATED : 5 August 1980

INVENTOR(S) : Ichimiya et al

It is certified that error appears in the above-identified patent and that said Letters Patent is hereby corrected as shown below:

line 44, change "low order bit" to --lower order bits--;
        line 45, change "29" to --28--;
        line 46, after "level," insert --and--;
        line 49, change "28" to --29--;
        line 53, change "39" to --35--;
        line 66, change "41" to --51--.

Col. 5,    line 5, change "50" to --52--;
        line 8, "pusles" should be --pulses--;
        line 12, change "In this while" to --During this time--;
        line 21, change "41" to --47--;
        line 25, "from" should be --form--;
        line 41, change "In" to --During--;
        line 42, change "while" to --time--;
        line 47, change "write in" to --writing into--;
        line 56, change "21" to --22--.

Col. 6,    line 14, change "read of" to --reading--; delete the second occurence of "the";
        line 15, change "order of address " to --address order--;
        line 29, delete "the";
        line 46, "its all" should be --all its--;
        line 48, "68" should be --61--;
        line 49, "41" should be --43--;
        line 58, "its all" should be --all its--;
        line 59, change "60" to --50--.

Col. 7,    line 10, after "reset" insert --it--;
        line 26, change "24" to --25--;
        line 29, after "line" insert --26--;

UNITED STATES PATENT AND TRADEMARK OFFICE
CERTIFICATE OF CORRECTION

PATENT NO. : 4,216,533

DATED : 5 August 1980

INVENTOR(S) : Ichimiya et al

It is certified that error appears in the above-identified patent and that said Letters Patent is hereby corrected as shown below:

line 30, change "24" to --25--;
           line 31, change "62" to --65--;
           line 42, change "Also" to --Also, as--.

Col. 8,   line 6, after "pattern" insert --address--;
           line 12, change "is detected" to --detects--.

Col. 9,   line 2, "fo" should be --of--;
           line 15, change "increase" to --by increasing--;
           line 16, delete "a";
           line 17, delete "counter"; change "use" to --using--;
           line 19, after "25," insert --to--;
           line 21, before "use" insert --to--;
           line 22, after "and" insert --to--;

Claim 1,   line 4, after "patterns" insert --at respective addresses--;
           line 6, change "memories and of" to --memories;--,
           line 7, before "the" insert --, each said high speed memory having--;
           line 8, change "pattern" to --transfer--;
           line 11, delete "one of";
           between lines 13 and 14, insert --pattern data select means connected to the first and second high-speed memories to select and output data as output patterns read out of the first and second high-speed memories;--
           line 15, after "address" insert --for reading out the high speed memories--;

UNITED STATES PATENT AND TRADEMARK OFFICE
CERTIFICATE OF CORRECTION

PATENT NO. : 4,216,533

DATED : 5 August 1980

INVENTOR(S) : Ichimiya et al

It is certified that error appears in the above-identified patent and that said Letters Patent is hereby corrected as shown below:

line 17, after "address" insert --for reading out the low speed memories--;
    line 19, change "one of the pattern generating address" to --addresses--;
    line 20, change "a low order bit" to --from lower order bits--;
    line 24, change "one of the pattern generating address" to --addresses--;
    line 25, change "the low order bit" to --from lower order bits--;
    line 33, change "and output them" to --for output--;
    line 35, change "means and" to --means, so--;
    line 38, change "low" to --lower--;
    line 41, after "transfer" insert --data--;
    line 43, change entire line to read, --one of said high-speed memories, the lower order bits of the--;
    line 44, change "are applied to the said one" to --generator are applied to said--;
    line 45, "fo" should be --of--;
    line 48, change "and output them" to --for output--.

Claim 2,   line 6, change "words of one" to --words of each--.

Claim 3,   line 9, after "generator" insert --unit--;
    line 11, change "the low" to --said lower--;
    line 12, change "bit" to --bits--; after "address" insert --generator--.

Claim 5,   line 5, after "then" insert --to--.

UNITED STATES PATENT AND TRADEMARK OFFICE
CERTIFICATE OF CORRECTION

PATENT NO. : 4,216,533

DATED : 5 August 1980

INVENTOR(S) : Ichimiya et al

It is certified that error appears in the above-identified patent and that said Letters Patent is hereby corrected as shown below:

Claim 6, line 2, change "multiplexor" to --multiplexer--;
line 6, change "multiplexor" to --multiplexer--.
Claim 7, line 2, change "multiplexor" to --multiplexer--;
line 8, change "multiplexor" to --multiplexer--.
Claim 10, line 1, change "generating" to --generator--;
line 7, change "a" to --the--;
line 8, change "remaining low" to --the remaining lower--.

Signed and Sealed this

Twenty-sixth Day of October 1982

[SEAL]

Attest:

Attesting Officer

GERALD J. MOSSINGHOFF

Commissioner of Patents and Trademarks

UNITED STATES PATENT AND TRADEMARK OFFICE
CERTIFICATE OF CORRECTION

PATENT NO. : 4,216,533

DATED : 5 Aug. 1980

INVENTOR(S) : Yoshichika Ichimiya et al

Page 1 of 7

It is certified that error appears in the above-identified patent and that said Letters Patent is hereby corrected as shown below:

In the drawings, Figs. 1 and 2 should be shown as follows.

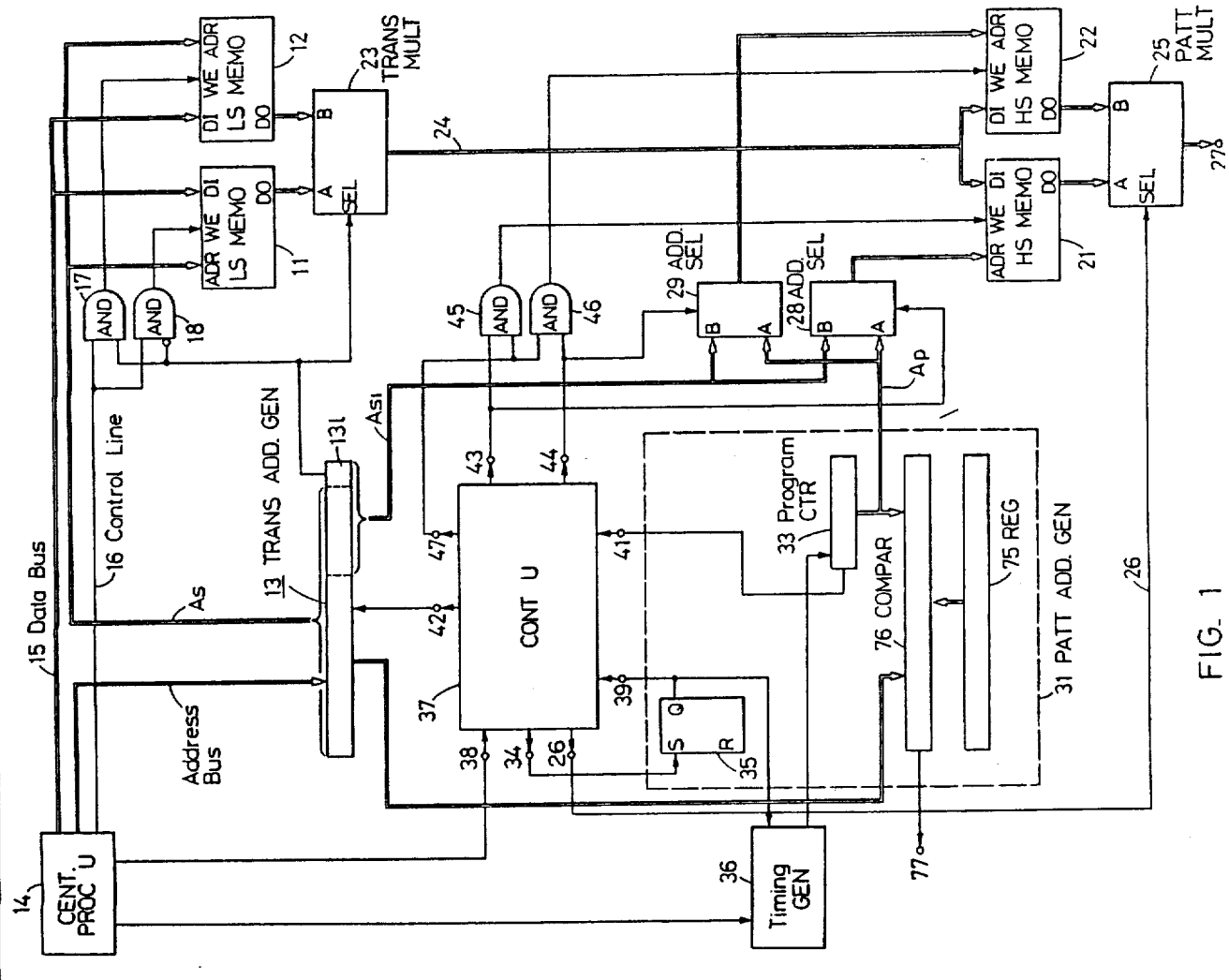

FIG. 1

UNITED STATES PATENT AND TRADEMARK OFFICE
CERTIFICATE OF CORRECTION

PATENT NO. : 4,216,533

DATED : 5 Aug. 1980

INVENTOR(S) : Yoshichika Ichimiya et al

Page 2 of 7

It is certified that error appears in the above-identified patent and that said Letters Patent is hereby corrected as shown below:

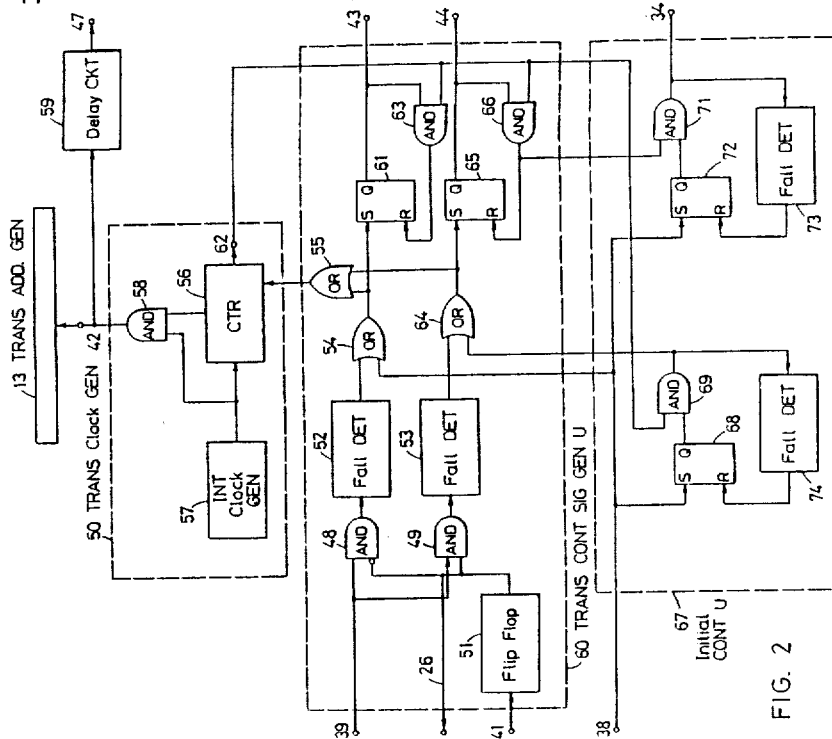

FIG. 2

UNITED STATES PATENT AND TRADEMARK OFFICE
CERTIFICATE OF CORRECTION

PATENT NO. : 4,216,533
DATED : 5 August 1980
INVENTOR(S) : Ichimiya et al

It is certified that error appears in the above-identified patent and that said Letters Patent is hereby corrected as shown below:

Col. 1, line 17, after "out" insert --according to a--;
line 18, "gramatically" should be --gram--;
line 22, after "high" insert --a--
line 31, "derived" should be --provided--;
line 34, delete "the";
line 43, change "whole to result" to --whole, resulting--;
after line 51, insert as a centered title, --SUMMARY OF THE INVENTION--;
line 60, delete entire line.

Col. 2, line 5, change "low" to --lower--;
line 9, change "are" to --is--;
line 11, after "of" insert --the--;
line 16 change "clocks" to --clock signals--;
line 19, delete "by"; change "one" to --each--;
line 20, change "control" to --controls--;
line 22, change "one" to --each--;
line 24, change "On top of that" to --Further--.

Col. 3, line 20, change "are" to --is--;
line 27, change "have been read until then" to --was previously read--;
line 31, delete "the";
line 52, delete "an";
line 57, change "low" to --lower--;
line 58, change "select" to --selected--;
line 63, change "29" to --22--;

Col. 4, line 9, change "the low order bit" to --lower order in--;
line 40, change "45" to --43--;

UNITED STATES PATENT AND TRADEMARK OFFICE
CERTIFICATE OF CORRECTION

PATENT NO. : 4,216,533

DATED : 5 August 1980

INVENTOR(S) : Ichimiya et al

Page 4 of 7

It is certified that error appears in the above-identified patent and that said Letters Patent is hereby corrected as shown below:

line 44, change "low order bit" to --lower order bits--;
           line 45, change "29" to --28--;
           line 46, after "level," insert --and--;
           line 49, change "28" to --29--;
           line 53, change "39" to --35--;
           line 66, change "41" to --51--.

Col. 5,     line 5, change "50" to --52--;
           line 8, "pusles" should be --pulses--;
           line 12, change "In this while" to --During this time--;
           line 21, change "41" to --47--;
           line 25, "from" should be --form--;
           line 41, change "In" to --During--;
           line 42, change "while" to --time--;
           line 47, change "write in" to --writing into--;
           line 56, change "21" to --22--.

Col. 6,     line 14, change "read of" to --reading--; delete the second occurence of "the";
           line 15, change "order of address " to --address order--;
           line 29, delete "the";
           line 46, "its all" should be --all its--;
           line 48, "68" should be --61--;
           line 49, "41" should be --43--;
           line 58, "its all" should be --all its--;
           line 59, change "60" to --50--.

Col. 7,     line 10, after "reset" insert --it--;
           line 26, change "24" to --25--;
           line 29, after "line" insert --26--;

UNITED STATES PATENT AND TRADEMARK OFFICE
CERTIFICATE OF CORRECTION

PATENT NO. : 4,216,533

DATED : 5 August 1980

INVENTOR(S) : Ichimiya et al

It is certified that error appears in the above-identified patent and that said Letters Patent is hereby corrected as shown below:

line 30, change "24" to --25--;
                line 31, change "62" to --65--;
                line 42, change "Also" to --Also, as--.

Col. 8,    line 6, after "pattern" insert --address--;
                line 12, change "is detected" to --detects--.

Col. 9,    line 2, "fo" should be --of--;
                line 15, change "increase" to --by increasing--;
                line 16, delete "a";
                line 17, delete "counter"; change "use" to --using--;
                line 19, after "25," insert --to--;
                line 21, before "use" insert --to--;
                line 22, after "and" insert --to--;

Claim 1,   line 4, after "patterns" insert --at respective addresses--;
                line 6, change "memories and of" to --memories;--,
                line 7, before "the" insert --, each said high speed memory having--;
                line 8, change "pattern" to --transfer--;
                line 11, delete "one of";
                between lines 13 and 14, insert --pattern data select means connected to the first and second high-speed memories to select and output data as output patterns read out of the first and second high-speed memories;--
                line 15, after "address" insert --for reading out the high speed memories--;

UNITED STATES PATENT AND TRADEMARK OFFICE
CERTIFICATE OF CORRECTION

PATENT NO. : 4,216,533

DATED : 5 August 1980

INVENTOR(S) : Ichimiya et al

It is certified that error appears in the above-identified patent and that said Letters Patent is hereby corrected as shown below:

line 17, after "address" insert --for reading out the low speed memories--;
        line 19, change "one of the pattern generating address" to --addresses--;
        line 20, change "a low order bit" to --from lower order bits--;
        line 24, change "one of the pattern generating address" to --addresses--;
        line 25, change "the low order bit" to --from lower order bits--;
        line 33, change "and output them" to --for output--;
        line 35, change "means and" to --means, so--;
        line 38, change "low" to --lower--;
        line 41, after "transfer" insert --data--;
        line 43, change entire line to read, --one of said high-speed memories, the lower order bits of the--;
        line 44, change "are applied to the said one" to --generator are applied to said--;
        line 45, "fo" should be --of--;
        line 48, change "and output them" to --for output--.

Claim 2, line 6, change "words of one" to --words of each--.

Claim 3, line 9, after "generator" insert --unit--;
        line 11, change "the low" to --said lower--;
        line 12, change "bit" to --bits--; after "address" insert --generator--.

Claim 5, line 5, after "then" insert --to--.

UNITED STATES PATENT AND TRADEMARK OFFICE
CERTIFICATE OF CORRECTION

PATENT NO. : 4,216,533

DATED : 5 August 1980

INVENTOR(S) : Ichimiya et al

It is certified that error appears in the above-identified patent and that said Letters Patent is hereby corrected as shown below:

```
Claim 6,    line 2, change "multiplexor" to --multiplexer--;
            line 6, change "multiplexor" to --multiplexer--.
Claim 7,    line 2, change "multiplexor" to --multiplexer--;
            line 8, change "multiplexor" to --multiplexer--.
Claim 10,   line 1, change "generating" to --generator--;
            line 7, change "a" to --the--;
            line 8, change "remaining low" to --the
        remaining lower--.
```

This certificate supersedes Certificate of Correction issued October 26, 1982.

Signed and Sealed this

Eighth Day of October 1985

[SEAL]

Attest:

Attesting Officer

DONALD J. QUIGG

Commissioner of Patents and Trademarks—Designate